Figure 1:
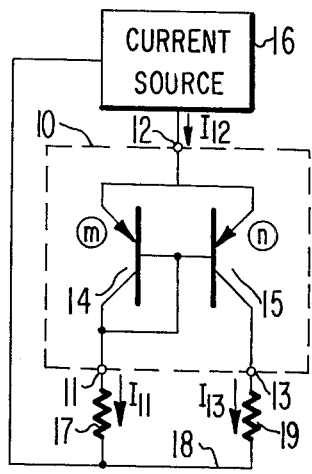

United States Patent [19]
Schade, Jr.

[11] 3,952,257
[45] Apr. 20, 1976

[54] CURRENT PROPORTIONING CIRCUITS

[75] Inventor: Otto Heinrich Schade, Jr., North Caldwell, N.J.

[73] Assignee: RCA Corporation, New York, N.Y.

[22] Filed: Oct. 29, 1974

[21] Appl. No.: 518,719

[52] U.S. Cl. .................... 330/22; 330/17; 330/19
[51] Int. Cl.² ............................................. H03F 3/04
[58] Field of Search .................... 330/17, 19, 22

[56] References Cited
UNITED STATES PATENTS 3,766,543   10/1973   Te Winkel .................... 340/347
3,852,678   12/1973   Frye ............................. 330/22 X Primary Examiner—R. V. Rolinec
Assistant Examiner—Lawrence J. Dahl
Attorney, Agent, or Firm—H. Christoffersen; S. Cohen; A. L. Limberg

[57] ABSTRACT

A current mirror amplifier is supplied input current through the terminal conventionally common to its input and output circuits, which input current is split into two portions related as the gain of the current mirror amplifier. Either or both of these portions may be utilized as an output current.

12 Claims, 7 Drawing Figures

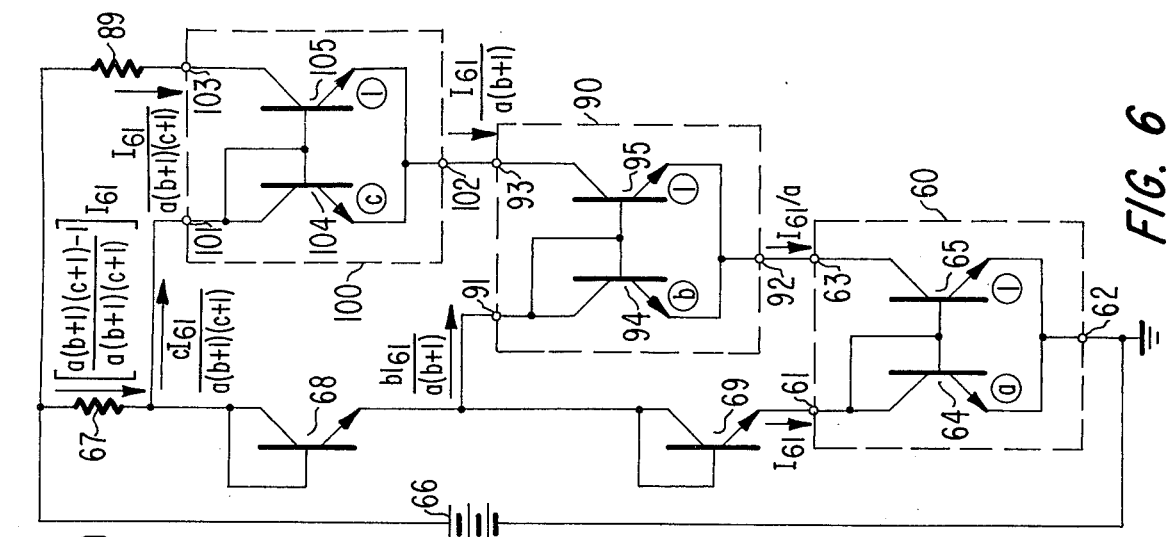

CURRENT PROPORTIONING CIRCUITS

The present application is related to current proportioning circuits.

A current mirror amplifier (CMA) is a circuit including a pair of mirroring transistors with matched or proportioned transconductances ($g_m$'s). The emitter electrodes of these transistors are connected to the common terminal of the amplifier. The first transistor has its collector electrode coupled to the input terminal of the amplifier and has collector-to-base feedback which adjusts its base-emitter potential to condition it for collector current flow substantially equal to applied input current. The base-emitter potential of the second transistor is caused to be the same as the base-emitter potential of the second transistor —for example, by parallelly connecting their base-emitter junctions. This conditions the second transistor for collector current flow, which is coupled to the output terminal of the CMA.

The current gain of a CMA can be made substantially equal to the transconductance of the second transistor divided by the transconductance of the first transistor. This ratio can be predicted with a high degree of confidence by proportioning the respective areas of the base-emitter junctions of transistors having similar diffusion or ion implantation profiles.

CMA's may be classified according to the conductivity type of their mirroring transistors—that is, their first and second transistors as defined previously. One conductivity type of CMA employs NPN bipolar transistors or N-channel field-effect transistors as mirroring transistors; the other conductivity type of CMA employs PNP bipolar transistors or P-channel field-effect transistor as mirroring transistors.

The present invention is directed to current splitter circuits in which input current is applied to the common terminal of a CMA to cause first and second output current flows from its input and output terminals, respectively, those terminals being defined as set forth in the preceding paragraphs.

Figure 3:
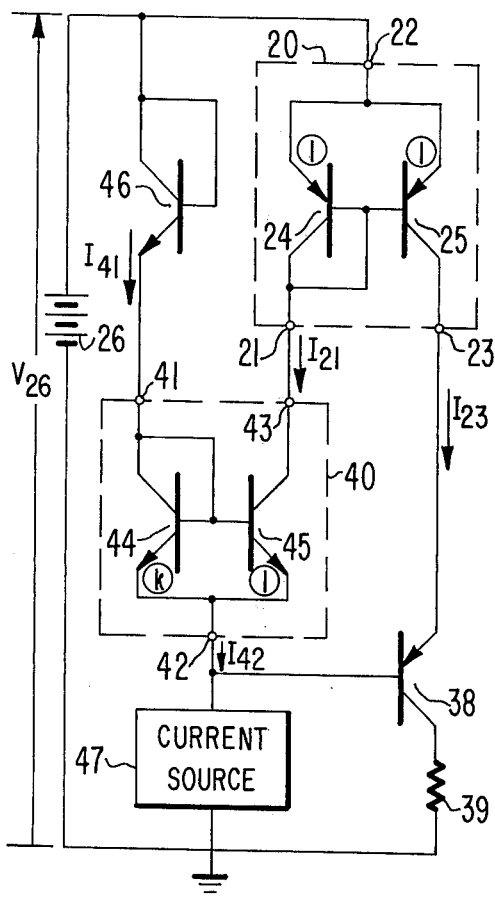
Figure 2:
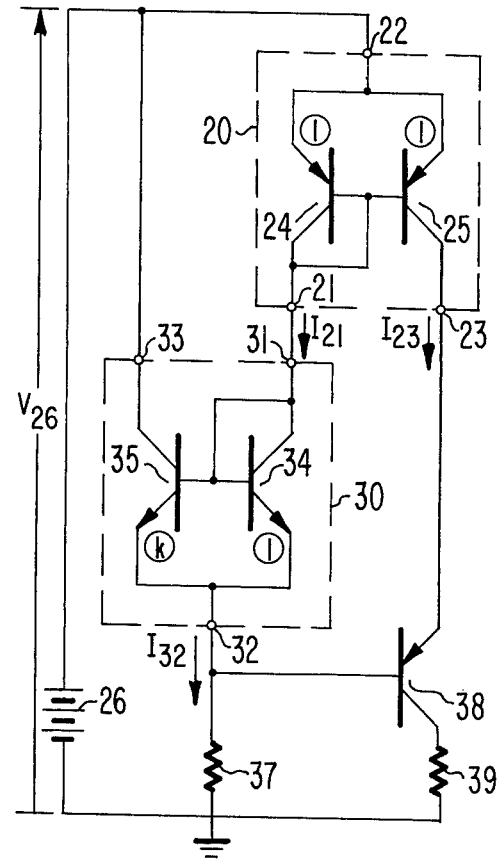
Figure 7:
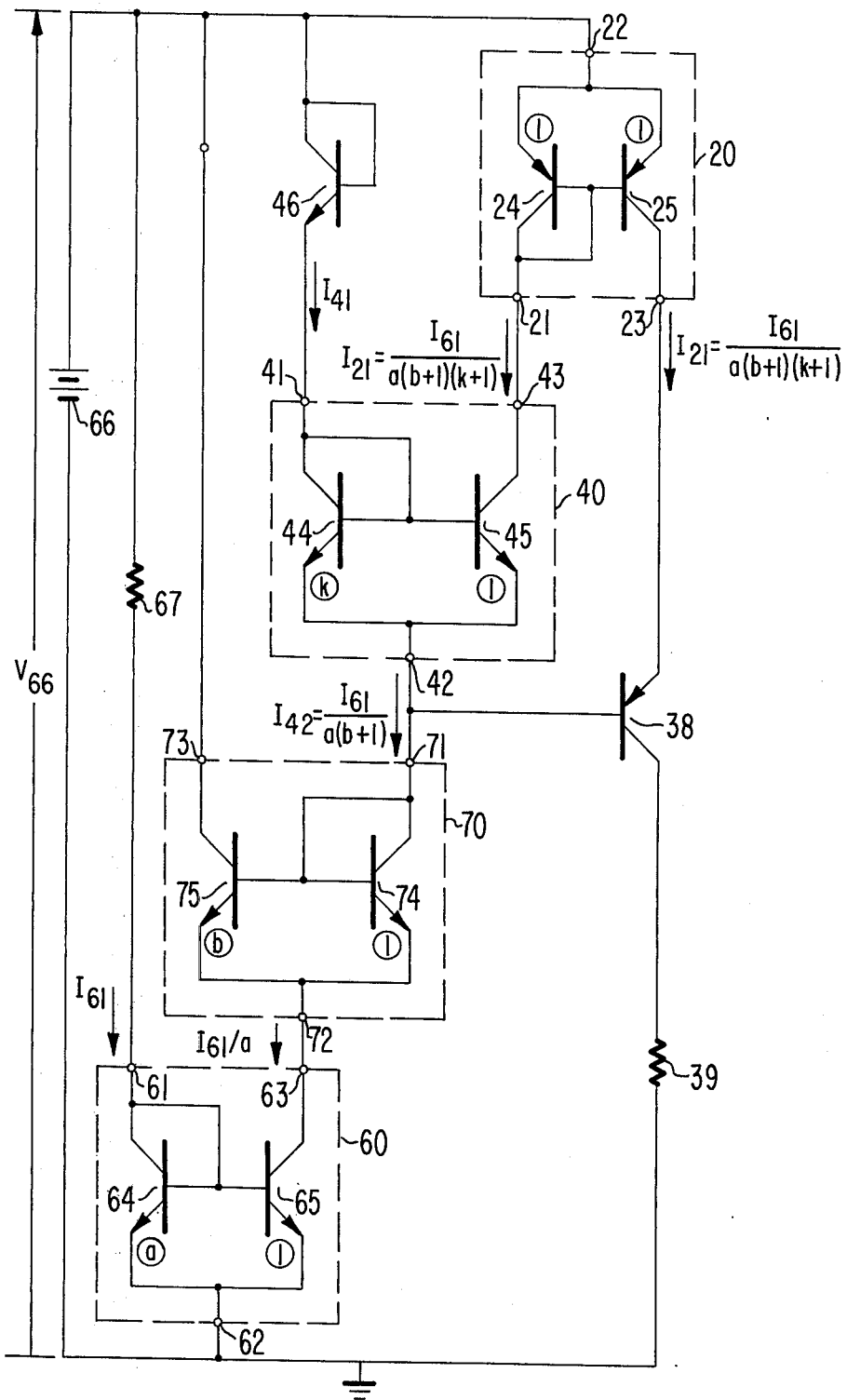

In the drawing:

FIG. 1 is a schematic diagram of a current mirror amplifier used for current splitting;

each of FIGS. 2, 3 and 4 is a schematic diagram of a composite current mirror amplifier used to obtain a stepped down positive output current responsive to a negative input current;

each of FIGS. 5 and 6 is a schematic diagram of a composite current mirror amplifier used to obtain a stepped down negative output current responsive to a positive input current; and FIG. 7 is a schematic diagram of a composite current mirror amplifier used to obtain a stepped down positive output current responsive to a positive input current.

Each of the figures embodies an aspect of the present invention.

In FIG. 1, a CMA 10 has an input terminal 11, a common terminal 12, and an output terminal 13. CMA 10 may be any of the several known types of CMA— e.g., the effective areas $A_{14}$ and $A_{15}$ of the base-emitter junctions of transistors 14 and 15 may be in the ratio $m$ to $n$. Here and in the remaining figures, the areas are indicated by letters (or numbers) within circles.

Unlike conventional CMA connections, the current flow through input terminal 11 is not determined by a current source connected thereto. Rather, a current source 16 supplies a current $I_{12}$ to the common terminal 12. One portion of this current flows to input terminal 11 and the other to output terminal 13. The current $I_{12}$ equals the combined emitter currents $I_{14}$ and $I_{15}$ of transistors 14 and 15, respectively. That is, $$I_{12} = I_{E14} + I_{E15} \tag{1}$$

The base-emitter circuits of transistors 14 and 15 are parallelled such that their respective base-emitter potentials $V_{BE14}$ and $V_{BE15}$ are equal.

$$V_{BE14} = V_{BE15} \tag{2}$$

Transistors made of the same material and with identical diffusion or ion implantation profiles will exhibit equal densities of current through their base-emitter junctions for equal base-emitter potentials. That is, $$(I_{E14}/A_{14}) = (I_{E15}/A_{15}) \tag{3}$$

As noted above, $$(A_{14}/A_{15}) = (m/n) \tag{4}$$

Combining equations 3 and 4, to eliminate $A_{14}$ and $A_{15}$ and rearranging, $$(I_{E14}/I_{E15}) = (m/n) \tag{5}$$

That is, the current $I_{12}$ splits, a portion $mI_{12}/(m+n)$ of it flowing as emitter current through transistor 14 and a portion $nI_{12}/(m+n)$ of it flowing as emitter current through transistor 15.

Currents $I_{11}$ and $I_{13}$ flow from the input terminal 11 and output terminal 13, respectively, of CMA 10. Current $I_{11}$ consists of the collector current $I_{C14}$, the base current $I_{B14}$ of transistor 14, and the base current $I_{B15}$ of transistor 15. Current $I_{13}$ consists of the collector current of transistor 15.

$$I_{11} = I_{C14} + I_{B14} + I_{B15} \tag{6}$$

$$I_{13} = I_{C15} \tag{7}$$

If transistors 14 and 15 have reasonably high common-emitter forward current gains, the collector current will substantially exceed their respective base currents or indeed their combined base currents. Further, their collector currents will be substantially equal to their emitter currents, the emitter current of the transistor being equal to the sum of its collector and base currents. In such instance, to good approximation, $$(I_{11}/I_{13}) = (m/n) \tag{8}$$

The current $I_{11}$ flowing through resistor 17 will develop an IR potential drop thereacross which will determine the biasing of the joined base electrodes of transistors 14 and 15 relative to the potential at node 18. The joined emitter electrodes of transistors 14 and 15 will be more positive in potential than their base electrodes by an amount $V_{BE14} = V_{BE15}$ as previously noted. To prevent saturation of transistor 15, the resistance of resistor 19 must be chosen so that the IR potential drop thereacross caused by $I_{13}$ flowing therethrough will not appreciably exceed the IR potential drop across resistor 17.

The joined base electrodes of transistors 14 and 15 may be connected to any point of reference potential such that their base-emitter junctions are forward-biased and their collector-emitter junctions are not, without interfering with the splitting of the current $I_{12}$ between the emitter electrodes of transistors 14 and 15 to the collector electrode of transistor 14 conveniently provides the necessary path for the base currents of transistors 14 and 15 incurred as a result of the splitting of current $I_{12}$ between their emitters. The connection is advantageous in that it sets up the biasing of transistor 14 so that it appropriates to itself a very small operating potential. In the case of a direct connection as shown in FIG. 1, this potential is equal to the base-emitter offset potential of the transistor which is only several tenths of a volt. The CMA connection dispenses with the need for resistive networks to bias the base electrodes of transistors 14 and 15. This is desirable in monolithic integrated circuitry since the relatively large resistances required for low current transistor base biasing would take up considerable area on the integrated circuit die. Also, the current taken up for biasing purposes in the CMA current-splitting configuration is solely that sufficient to support the base current flows of the transistors; there is no current wasted in a resistive biasing network.

The FIG. 1 configuration is implemented with PNP transistors since current splitting circuits are usually described more straightforwardly by assuming a source of positive current and analyzing the splitting of this current into fractions. Indeed, such implementation may be done in practice. However, in conventional monolithic integrated circuit technologies using reverse biased junction techniques for isolating elements from each other, NPN transistors are formed with a vertical structure, while PNP transistors having collector regions independent of the substrate are formed with a lateral structure which, except at low current levels (less than 100 microamperes), take up considerably more area on the integrated circuit die. This leads to a problem in these integrated circuit technologies when one wishes to make PNP CMA circuits having $m$ to $n$ ratios appreciably larger than unity, since one or the other of the lateral transistors has to take up considerable area on the die. A further aspect of the present invention is that such a PNP CMA can be simulated at considerable saving in die area. Such a simulative circuit includes a first CMA with NPN mirroring transistors. Input signals are applied to the common terminal of this CMA rather than to its input terminal. The simulative circuit also includes a second CMA, using PNP mirroring transistors with an $m$ to $n$ ratio relatively close to unity, connected in cascade after the first CMA.

FIGS. 2, 3, 4 and 7 show representative configurations of the above type of circuit. In each such circuit, the second CMA 20 has an input terminal 21, a common terminal 22 and an output terminal 23. PNP transistors 24 and 25 have emitter electrodes connected to common terminal 22 of CMA 20. The collector electrodes of transistors 24 and 25 are connected to the input terminal 21 and output terminal 23, respectively, of current mirror amplifier 22. Transistor 24 has its collector electrode connected to its base electrode thereby to provide the transistor with direct coupling collector-to-base feedback, and has its collector electrode similarly connected to the base electrode of transistor 25. Transistor 24 and 25 therefore have equal potentials appearing across their respective base-emitter junctions. These base-emitter junctions are shown as having equal areas as indicated by the encircled numbers "1". Accordingly, substantially equal currents are supplied from the collector electrodes of transistors 24 and 25. So long as these collector currents are the dominant components of the currents $I_{21}$ and $I_{23}$ flowing from terminals 21 and 23, $I_{21}$ and $I_{23}$ will also be substantially equal to each other. The common terminal 22 of CMA is shown connected to the positive terminal of a source 26 to receive operating potential $V_{26}$.

Focusing now on the FIG. 2 configuration, a CMA 30 is connected at its input terminal 31 to the input terminal 21 of CMA 20 and at its output terminal 33 to the B+ terminal of source 26. CMA 30 includes NPN transistor 34 connected at its collector electrode to input terminal 31 and NPN transistor 35 connected at its collector electrode to output terminal 33. The joined base electrodes of transistors 34 and 35 are also connected to input terminal 31 of CMA 30 and thence to input terminal 21 of CMA 20. Terminal 21 is held at a potential $1V_{BE}$ lower than the potential $V_{26}$ by the $1V_{BE}$ base-emitter offset potential of transistor 24. ($V_{BE}$ has a value of about 0.65 volts in a silicon transistor over a wide range of emitter currents.) The potential at the joined emitter electrodes of transistors 34 and 35 will be $1V_{BE}$ less positive still because of their emitter follower action, and so it is seen that the potential at common terminal 32 of CMA 30 is maintained $2V_{BE}$ less positive than $V_{26}$. Assuming $V_{26}$ to be considerably larger than $2V_{BE}$, the potential across resistor 37 will be substantially invariant, equaling $V_{26}$ minus $2V_{BE}$. Therefore, resistor 37 will, in this circuitry, function in accordance with Ohm's Law as a constant-current source. The current $I_{32}$ withdrawn from the common terminal 32 of CMA 30, will except for the negligible base current of transistor 38, equal the current flow through resistor 37.

Transistors 34 and 35 are connected to have equal base-emitter voltages, and their respective base-emitter junctions have areas in 1:k ratio causing CMA 30 to have a current gain of $k$, between its input and output terminals 31 and 33. The number $k$ exceeds unity, and in accordance with the teaching above only a $1/(k+1)$ fraction of current $I_{32}$ will be drawn through the input terminal 31 of CMA 30. That is, $$I_{21} = (I_{32}/(k+1)) \tag{9}$$

and, since CMA 20 has substantially unity current gain, to good approximation $$I_{23} = (I_{32}/(k+1)) \tag{10}$$

Now, it is easy to obtain large $k$'s with vertical structure NPN transistors without consuming large areas of the integrated-circuit die as previously noted. So, scaling current $I_{23}$ to a fraction of $I_{32}$ is substantially more feasible with the FIG. 2 circuit than with the prior art CMA using all PNP transistors.

Since there is only a $2V_{BE}$ offset potential between terminals 22 and 32, the entire CMA of FIG. 2 takes up very little of the available operating potential provided by source 26. This particular offset potential is also convenient for biasing the base electrode of transistor 38 connected in cascode with transistor 25. This cascode arrangement raises the source impedance to a load such as resistor 39. The potential which can appear across resistor 39 without saturating transistor 38 can approach within $1V_{BE} + 1V_{SAT}$ of the positive supply potential provided by source 26, where $V_{SAT}$ is the collector-to-emitter saturation potential of transistor 38.

Now, for large values of $k$, the base current drawn by transistor 35 may become greater than a fraction of the collector current of transistor 34, which will affect the accuracy of the current splitting afforded by CMA 30. One solution to this problem is to cascade current splitting CMA's with smaller $k$'s to get the desired reduction in current level, which type of cascading will be discussed in detail later in the specification. An alternative way of solving the problem is to use, as a current splitter, a CMA (40, 50) in which the self-biased transistor has the relatively large effective base-emitter junction area rather than the dependently biased transistor and in which the collector current of the dependently biased transistor supplies input current $I_{21}$ to the current mirror amplifier 20. Representative circuits for doing this are shown in FIGS. 3, 4 and 5.

Referring to FIG. 3, CMA 40 has its input terminal 41 connected to the positive terminal of source 26 by means of a self-biased transistor 46. Its common terminal 42 is connected to have a current withdrawn therefrom by a current source 47, which may be provided by a resistor (such as 37 of FIG. 2) connecting terminal 42 to ground reference potential, or by other means such as through the collector-to-emitter path of a transistor. The output terminal 43 of the CMA 40 is connected to the input terminal 21 of CMA 20. Transistors 44 and 45 are connected to have equal base-emitter voltages. The effective area of the base-emitter junction of transistor 44 is $k$ times as large as that of transistor 45, $k$ being a number larger than unity. So, CMA 40 exhibits a current gain of $1/k$ between its input and output terminals 41 and 43. So, in accordance with the teaching above only a $1/(k+1)$ fraction of current $I_{42}$ withdrawn from common terminal 42 will be supplied to output terminal 43 as current $I_{21}$ from the input terminal 21 of CMA 20. That is, $$I_{21} = I_{42}/(k+1) \qquad (11)$$

and, since CMA 20 has substantially unity current gain, to good approximation $$I_{23} = I_{42}/(k+1) \qquad (12)$$

The current $I_{41}$ demanded at input terminal 41 of CMA 40 is $k$ times larger than that demanded at output terminal 43. That is, $$I_{41} = k\, I_{42}/(k+1) \qquad (13)$$

The current $I_{41}$ is drawn through self-biased transistor 46, which as is well-known, behaves as a diode, to bias terminal 41 less positive by $1V_{BE}$ than $V_{26}$. The base-emitter offset potential of transistor 44 places common terminal 42 at a potential $2V_{BE}$ less positive than $V_{26}$. So, transistor 45 is operated without fear of saturation and terminal 42 is at a potential appropriate for biasing the base electrode of a transistor 38 in cascode connection with transistor 25 of CMA 38.

The FIG. 4 circuit functions similarly to the FIG. 3 circuit, with the CMA 40 and self-biased transistor 46 being replaced by a CMA 50 of another well-known type. CMA 50 has an input terminal 51 directly connected to the positive terminal of source 26, has a common terminal 52 from which a current $I_{52}$ is withdrawn by current source 47, and has an output terminal 53 connected to withdraw current $I_{21}$ from input terminal 21 of current mirror amplifier 20. Transistors 54 and 55 have their base electrodes offset $1V_{BE}$ from $V_{26}$ by the emitter-follower action of transistor 56, and the common terminal 52 is $1V_{BE}$ still less positive owing to the base-emitter potential of transistor 54. Transistors 54 and 55 have the effective areas of their respective base-emitter junctions in $k:1$ ratio just as transistors 44 and 45 do in FIG. 2 and perform similarly insofar as splitting current between them. Transistor 54 does see a $2V_{BE}$ emitter-to-collector potential while transistor 44 sees only a $1V_{BE}$ emitter-to-collector potential.

The collector electrode of transistor 56 is connected via terminal 57 to the positive terminal of source 26, just as the collector electrode of transistor 54 is via input terminal 51. In effect, the connection of the input terminal 51 to the positive terminal of source 26 causes transistor 56 to be self-biased, which would not be so in a conventional connection of CMA 50. It is advantageous insofar as area taken up on the integrated circuit die is concerned, that transistors 54 and 56 have their collector regions at the same potentials, so these regions need not be isolated from each other. (In the FIG. 2 circuit, transistors 46 and 47 do not enjoy this advantage.)

An interesting observation can be made comparing the FIG. 3 and FIG. 4 circuits. One of the continuing concerns in current mirror amplifier design is how the disposition of the base currents of the current mirroring transistors (which may be part of the input current or part of the output current or part of neither) affects current gain between the input and output terminals of the CMA. The effects of this problem less pronounced if the common-emitter current gains of the mirroring transistors are high so their base currents are relatively small compared to their collector currents. CMA 50 uses the commonly-used technique of routing these base currents to the operating potential supply via a path other than the paths through the input and output terminals of the current mirror amplifier, while CMA 40 has the base currents routed through its input terminal. In a conventional connection of these CMA's, CMA 50 will exhibit a current gain between its input and output terminals much less perturbed by base current flows than the current gain exhibited by CMA 40. But, in the present circuit, CMA 50 enjoys no advantage in this regard because the alternative path for base currents parallels the path through the input terminal, so the ultimate route for the base currents is the same for both circuits.

When one applies or withdraws input current from the common terminal of the CMA, one should understand that $1/\beta$ portion of that current is the combined base currents of the mirroring transistors. so, $1/\beta$ portion of the mirroring transistor collector current which is to be utilized must be admixed with that collector current in order to obtain independency of $\beta$ in the splitting of the current applied or withdrawn from the common terminal of the CMA. This means that apportioning the base currents of the mirroring transistors between the input and output terminals of the CMA in proportion to its current gain is the correct technique for obtaining independency of $\beta$ in current splitting.

Another area where a CMA current applied to its common terminal rather than its input terminal is advantageous is in the development of an output current relatively small as compared to an input current by current mirroring succeeded by current splitting one or more times. This approach to developing attenuating currents is much more economical of area on an integrated circuit die than is attenuation by conventional current mirroring along. FIGS. 5 and 6 illustrate this type of circuit.

In FIG. 5, the CMA 60 is conventionally connected, its common terminal 62 being connected to ground reference potential. The input terminal 61 of CMA 60 has input current $I_{61}$ applied thereto—as shown by means of resistor 67 connecting it to the positive terminal of a source 66 of operating potential $V_{66}$. The potential appearing across resistor 67 is $V_{66}$ minus the $1V_{BE}$ offset across the self-biased transistor 64, and the current $I_{61}$ through resistor 67 has a value in accordance with Ohm's Law. The transconductances of transistors 64 and 65 are in a:1 ratio, a being at least unity, so CMA 60 has a current gain of $1/(a)$ and demands a current $I_{61}/a$ at its output terminal 63.

This $I_{61}/a$ current is withdrawn from the common terminal 72 of a CMA 70, comprising transistors 74 and 75 with transconductances in 1:b ratio and so having a current gain, b. The gain b is made at least unity. In accordance with the teaching above, CMA 70 responds to the $I_{61}/a$ current demand at its common terminal 72 in the following two ways. It demands a current of magnitude $bI_{61}/a(b+1)$ at its output terminal 73 from source 66 and also it demands a current of magnitude $I_{61}/a(b+1)$ at its input terminal 71.

This $I_{61}/a(b+1)$ current is withdrawn from the current terminal 82 of a CMA 80 comprising transistors 84 and 85 with transconductances in 1:c ratio and so having a current gain, c. The gain c is made at least unity. CMA 80 responds to the $I_{61}/a(b+1)$ demand by itself demanding a current of magnitude $cI_{61}/a(b+1)(c+1)$ at its output terminal 83 and a current of magnitude $I_{61}/a(b+1)(c+1)$ at its input terminal 81. The former demand is met directly from source 66; and the latter, from source 66 through a utilization circuit as, for example, is provided by resistor 89. This utilization circuit could take other forms—e.g., the input circuit of a CMA like 20 of the circuits of FIGS. 2–4.

The biasing of input terminal 81 of CMA 80 defines the potentials in the CMA's 70 and 80. In the FIG. 5 circuit, terminal 81 is less positive than $V_{66}$ by the potential drop $$\frac{I_{61} R_{89}}{a/b+1)(c+1)}$$

across resistor 89, having a resistance $R_{89}$. Terminals 82 and 71 are $1V_{BE}$ still less positive because of the emitter follower action of transistor 84; and terminals 72 and 63, $1V_{BE}$ further less positive because of the emitter-follower action of transistor 74.

Suppose, for example, a, b and c were each equal to 4. The current flow in resistor 89 would be 1/200 times as large as $I_{61}$. The combined base-emitter junction areas of transistors 64, 65, 67, 74 and 84, 85 assuming transistors 65, 74 and 84 to have unit areas, would be $a+1+1+b+1+c$ which equals 15 unit areas. This contrasts with a conventional current mirror amplifier providing a 200:1 reduction of current having 201 unit areas. So, the FIG. 5 circuit can be integrated within a much smaller area on an integrated circuit die.

FIG. 6 shows a cascade connection of the type of current splitter shown in FIG. 2. In the FIG. 6 circuit, responsive to a current $I_{61}$ supplied to its input terminal 61, CMA 60 demands a current of magnitude $I_{61}/a$ at its output terminal 63. In the FIG. 6 circuit, this current is withdrawn from the common terminal 92 of a CMA 90, comprising transistors 94 and 95 having transconductances in b:1 ratio and so having a current gain $1/b$ which is less than unity. CMA 90 responds to the $I_{61}/a$ a current demanded of it, by itself demanding a current of magnitude $bI_{61}/a(b+1)$ at its input terminal 91 and a current of magnitude $I_{61}/a(b+1)$ at its output terminal 93. Terminal 93 is connected to the common terminal 102 of a CMA 100, comprising transistors 104 and 105 having transconductances in c:1 ratio causing CMA 100 to exhibit a current gain $1/c$ which is less than unity. CMA 100 responds to the $I_{61}/a(b+1)$ current demanded of it by itself demanding currents with respective magnitudes of $cI_{61}/a(b+1)(c+1)$ and $I_{61}/a(b+1)(c+1)$ at its input terminal 101 and its output terminal 103, respectively. The summed currents flowing to the input terminals 61, 91 and 101 of CMA's 60, 90 and 100, respectively, have a magnitude of $[a(b+1)(c+1)-1] I_{61}/a(b+1)(c+1)$ which is substantially equal to $I_{61}$ in most instances. The level of this current is determined in the FIG. 6 circuit, in accordance with Ohm's Law, the potential across resistor 67' being divided by its resistance $R_{67}$'. The potential across 67' is the operating potential provided by source 66 minus each of the $1V_{BE}$ offset potentials appearing across self-biased transistors 68, 69 and 64.

An attenuation of $[a(b+1)(c+1)-1]$ times is provided by CMA's 60, 90 and 100 acting together in the connections shown in FIG. 6. This is slightly less than that provided by the FIG. 5 circuit and additional potential offsetting transistors 68 and 69 are used. The circuit of FIG. 6 is advantageous, however, in that the biasing of CMA's 90 and 100 is referred to ground reference potential by means of self-biased transistors 68, 69 and 64 and are not referred to the potential at output terminal 103. This will be an even greater advantage in circuits where the constant current source provided by resistor 67' is replaced by a dynamic current source, and the potential at terminal 103 is modulated. Then, since the capacitances associated with CMA's 90 and 100 need not be charged and discharged, circuit response is faster.

The cascade connection of FIGS. 5 or 6 may be shortened by lopping off CMA 80 or 100, as the case may be. On the other hand, the cascade connection can be lengthened. Alternation of the two modes of current splitting in cascade connection is possible, as illustrated in FIG. 7. Any of these cascade connections of CMA's used as current splitters can be used to provide attenuated input current to a further CMA, conventionally arranged, in a manner similar to that aspect of the invention taught in connection with the circuits of FIGS. 2 and 4. In connection with that aspect of the invention, it should be remarked that it is also useful in the integrated circuit technologies employing NPN bipolar transistors and P-type field-effect transistors for developing current attenuators with minimum area on the die.

In the claims, the terms "supplying" and "returning" in reference to the flow of current are to be applied without regard to whether the sense of current flow referred to is positive or negative.

What is claimed is:

1. In combination:
   means for supplying an operating potential between first and second terminals;
   first and second current mirror amplifiers of complementary conductivity types, each having an input terminal, an output terminal and a common terminal;
   means connecting the input terminal of said first current mirror amplifier to said first terminal;
   a source of input current of predetermined value connected between said second terminal and the common terminal of said first current mirror amplifier;
   means connecting the output terminal of said first current mirror amplifier to the input terminal of said second current mirror amplifier;
   means connecting the common terminal of said second current mirror amplifier to said first terminal; and
   utilization means, connected between the output terminal of said second current mirror amplifier and said second terminal, for utilizing output current flowing responsive to said input current.

2. In combination:
   means for supplying an operating potential between first and second terminals;
   first and second current mirror amplifiers of complementary conductivity types, each having an input terminal, an output terminal and a common terminal;
   means connecting the input terminal of said first current mirror amplifier to the input terminal of said second current mirror amplifier;
   a source of input current of predetermined value connected between said second terminal and the common terminal of said first current mirror amplifier;
   means connecting the output terminal of said first current mirror amplifier to said first terminal;
   means connecting the common terminal of said second current mirror amplifier to said first terminal; and
   utilization means, connected between the output terminal of said second current mirror amplifier and said second terminal, for utilizing output current flowing responsive to said input current.

3. In combination:
   means for providing an operating potential between first and second terminals;
   first and second current mirror amplifiers of the same conductivity type, each having an input terminal and a common terminal and an output terminal;
   a source of input current connected between said first terminal and the input terminal of said first current mirror amplifier;
   means connecting the common terminal of said first current mirror amplifier to said second terminal;
   means connecting the output terminal of said first current mirror amplifier to the common terminal of said second current mirror amplifier;
   means connecting the output terminal of said second current mirror amplifier to said first terminal; and
   means connecting the input terminal of said second current mirror amplifier and said first terminal and having included therewithin:
   utilization means connected between the input terminal of said second current mirror amplifier and said first terminal for conducting an output current flowing in response to said input current.

4. The combination set forth in claim 3 wherein said means connecting the input terminal of said second current mirror amplifier to said first terminal further includes:
   a third current mirror amplifier of the same conductivity type as said first and second current mirror amplifiers, having a common terminal connected to the input terminal of said second current mirror amplifier and having input and output terminals; and
   means connecting each of the input and output terminals of said third current mirror amplifier to said first terminal by separate paths, one of which includes said utilization means.

5. In combination:
   means for providing an operating potential between first and second terminals;
   first and second current mirror amplifiers of the same conductivity type, each having an input terminal and a common terminal and an output terminal;
   a source of input current connected between said first terminal and the common terminal of said first current mirror amplifier;
   means connecting the input terminal of said first current mirror amplifier to the common terminal of said second current mirror amplifier;
   means connecting the output terminal of said first current mirror amplifier to said second terminal;
   means connecting the output terminal of said second current mirror amplifier to said second terminal; and
   means connecting the input terminal of said second current mirror amplifier and said second terminal and having included therewithin:
   utilization means connected between the input terminal of said second current mirror amplifier and said second terminal for conducting an output current flowing in response to said input current.

6. In combination:
   means for providing an operating potential between first and second terminals;
   first and second current mirror amplifiers of the same conductivity type, each having an input terminal and a common terminal and an output terminal;
   a source of input current connected between said first terminal and the input terminal of said first current mirror amplifier;
   means connecting the common terminal of said first current mirror amplifier to said second terminal;
   means connecting the output terminal of said first current mirror amplifier to the common terminal of said second current mirror amplifier;
   means connecting the input terminal of said second current mirror amplifier to said first terminal; and
   means connecting the output terminal of said second current mirror amplifier and said first terminal and having included therewithin:
   utilization means connected between the output terminal of said second current mirror amplifier and said first terminal for conducting an output current flowing in response to said input current.

7. The combination set forth in claim 6 wherein said means connecting the output terminal of said second current mirror amplifier to said first terminal further includes:

a third current mirror amplifier also of said conductivity type, having a common terminal connected to the output terminal of said second current mirror amplifier and having input and output terminals; and means connecting each of the input and output terminals of said third current mirror amplifier to said first terminal by separate paths, one of which includes said utilization means.

8. In combination:

means for providing an operating potential between first and second terminals;

first and second current mirror amplifiers of the same conductivity type, each having an input terminal and a common terminal and an output terminal;

a source of input current connected between said first terminal and the common terminal of said first current mirror amplifier;

means connecting the input terminal of said first current mirror amplifier to said second terminal for referring the potential at the input terminal of said first current mirror amplifier to the potential at said second terminal;

means connecting the output terminal of said first current mirror amplifier to the common terminal of said second current mirror amplifier;

means connecting the input terminal of said second current mirror amplifier to said second terminal for referring the potential at the input terminal of said second current mirror amplifier to the potential at said second terminal; and means connecting the output terminal of said second current mirror amplifier and second terminal and having included therewithin:

utilization means connected between the output terminal of said second current mirror amplifier and said second terminal for conducting an output current flowing in response to said input current.

9. In combination:

means for providing an operation potential between first and second terminals;

first and second current mirror amplifiers of the same conductivity type, each having an input terminal and a common terminal and an output terminal;

a source of input current connected between said first terminal and the common terminal of said first current mirror amplifier;

means connecting the input terminal of said first current mirror amplifier to the common terminal of said second current mirror amplifier;

means connecting the output terminal of said first current mirror amplifier to said second terminal;

means connecting the input terminal of said second current mirror amplifier to said second terminal for referring the potential at the input terminal of said second current mirror amplifier to the potential at said second terminal;

means connecting the output terminal of said second current mirror amplifier and second terminal and having included therewithin:

utilization means connected between the output terminal of said second current mirror amplifier and said second terminal for conducting an output current flowing in response to said input current.

10. The combination set forth in claim 9 including a third current mirror amplifier with an input circuit corresponding to said utilization means, of a conductivity type complementary to that of said first and said second current mirror amplifiers, with an input terminal connected to the output terminal of said second current mirror amplifier, with a common terminal connected to said second terminal, and with an output terminal also including a load with a current path therethrough connected between the output terminal of said third current mirror amplifier and said second terminal.

11. An integrated current fractionalizing circuit comprising, in combination:

a first current mirror amplifier formed of transistors of a first conductivity type and with vertical geometry, said first current mirror amplifier having input and output and common terminals, the emitter-base junction of the one of those transistors connected to said output terminal having an area $k$ times as large as the emitter-base junction of the transistor connected to said output terminal, where $k$ is a relatively large number, said first current mirror amplifier being coupled at its output terminal to a point of operating potential;

current source means connected at one of its terminals to said common terminal of said first current mirror amplifier for withdrawing the current to be fractionalized from said common terminal, said current source means being connected at the other of its terminals to a point of reference potential;

a second current mirror amplifier formed of transistors which are of a second conductivity type and have lateral geometry, said second conductivity type being complementary to said first conductivity type, said second current mirror amplifier having input and output and common terminals, being connected at its input terminal to the input terminal of said first current mirror amplifier, and being connected at its common terminal to said point of operating potential; and fractional current utilization means connected between the output terminal of said second current mirror amplifier and said point of reference potential.

12. An integrated current fractionalizing circuit comprising, in combination:

a first current mirror amplifier formed of transistors which are of a first conductivity type and have vertical geometry, said first current mirror amplifier having input and output and common terminals, the emitter-base junction of the one of those transistors connected to said input terminal having an area $k$ times as large as the emitter-base junction of the transistor connected to said output terminal, where $k$ is a relatively large number, said first current mirror amplifier being coupled at its input terminal to a point of operating potential;

current source means connected at one of its terminals to said common terminal of said first current mirror amplifier for withdrawing the current to be fractionalized from said common terminal, said current source means being connected at the other of its terminals to a point of reference potential;

a second current mirror amplifier formed of transistors of a second conductivity type and with lateral geometry, said second conductivity type being complementary to said first conductivity type, said second current mirror amplifier having input and output and common terminals, being connected at its input terminal to the output terminal of said first current mirror amplifier, and being connected at its common terminal to said point of operating potential; and fractional current utilization means connected between the output terminal of said second current mirror amplifier and said point of reference potential.

* * * * *

UNITED STATES PATENT OFFICE
CERTIFICATE OF CORRECTION

PATENT NO. : 3,952,257

DATED : April 20, 1976

INVENTOR(S) : Otto Heinrich Schade, Jr.

It is certified that error appears in the above-identified patent and that said Letters Patent are hereby corrected as shown below:

Col. 2, equation (6) should read --- $I_{11}=I_{C14}+I_{B14}+I_{B15}$ ---
Col. 3, line 6, after "electrodes" insert --- as described above. The connection of the joined base electrodes ---
Col. 3, line 68, "Transistor" should read --- Transistors ---
Col. 4, line 10, after "CMA" insert --- 20 ---
Col. 4, equation (9) should read --- $I_{21}=I_{32}/(k+1)$ ---
Col. 4, equation (10) should read --- $I_{23}=I_{32}/(k+1)$ ---
Col. 5, equation (11) should read --- $I_{21}=I_{42}/(k+1)$ ---
Col. 6, line 35, after "problem" insert --- become ---
Col. 6, line 66, after "CMA" insert --- having ---
Col. 7, line 6, "along" should read --- alone ---
Col. 8, line 10, delete "a" at beginning of line
Col. 8, lines 19 & 20, "$I_{6t-1}/a(b+1)(c+1)$" should read --- $I_{61}/a(b+1)(c+1)$ ---
Col. 11, line 46, "operation" should read --- operating ---

Signed and Sealed this

Twenty-seventh Day of July 1976

[SEAL]

Attest:

RUTH C. MASON
*Attesting Officer*

C. MARSHALL DANN
*Commissioner of Patents and Trademarks*